United States Patent
Baccini

(10) Patent No.: US 8,256,375 B2
(45) Date of Patent: Sep. 4, 2012

(54) METHOD FOR THE PRODUCTION AND CONTROL OF PLATES FOR ELECTRONICS AND RELATED APPARATUS

(75) Inventor: Andrea Baccini, San Biagio di Callalta (IT)

(73) Assignee: Applied Materials Italia S.R.L., San Biagio di Callalta - Treviso (IT)

(*) Notice: Subject to any disclaimer, the term of this patent is extended or adjusted under 35 U.S.C. 154(b) by 842 days.

(21) Appl. No.: 12/256,767

(22) Filed: Oct. 23, 2008

(65) Prior Publication Data
US 2009/0269483 A1   Oct. 29, 2009

(30) Foreign Application Priority Data
Oct. 24, 2007 (IT) .............................. UD2007A0195

(51) Int. Cl.
| | |
|---|---|
| B05C 13/00 | (2006.01) |
| B05C 13/02 | (2006.01) |
| B05C 21/00 | (2006.01) |
| B05C 11/00 | (2006.01) |
| B05C 11/11 | (2006.01) |
| B05C 17/06 | (2006.01) |
| B05C 17/04 | (2006.01) |
| B41M 1/12 | (2006.01) |
| B41L 13/18 | (2006.01) |
| B41L 27/00 | (2006.01) |
| B65H 1/00 | (2006.01) |

(52) U.S. Cl. ........ 118/712; 118/500; 118/670; 118/675; 118/713; 118/714; 101/123; 101/126; 101/129; 414/222.01; 414/222.02

(58) Field of Classification Search .............. 118/670, 118/713, 714, 675
See application file for complete search history.

(56) References Cited

U.S. PATENT DOCUMENTS

| 4,981,074 A | 1/1991 | Machita et al. |
| 6,507,933 B1 | 1/2003 | Kirsch et al. |
| 2004/0173148 A1* | 9/2004 | Kim et al. ............... 118/670 |
| 2007/0165940 A1 | 7/2007 | Ishikawa |
| 2008/0034990 A1* | 2/2008 | Hilpert et al. ............ 101/126 |

FOREIGN PATENT DOCUMENTS

| DE | 10 2006 015 686 | 8/2007 |
| EP | 535338 A1 * | 4/1993 |

* cited by examiner

*Primary Examiner* — Dah-Wei Yuan
*Assistant Examiner* — Binu Thomas
(74) *Attorney, Agent, or Firm* — Patterson & Sheridan, LLP

(57) ABSTRACT

A method for the production and control of plates for electronics comprising a first step in which a plate is positioned, by means of positioning means, in a loading station; a second step in which the plate is disposed in a deposition station associated with a unit for depositing metal, or other material, in which the metal is deposited on the plate, in order to generate on the plates metal tracks, according to a pre-determined and desired topological disposition; a third step in which the plate is disposed in an exit station and a detection means is activated so as to detect the presence of defects in the plate; and a fourth step in which the plate is discharged from the exit station. In the first step the detection means is activated to identify defects in the plate disposed in the loading station. In the second step the deposition unit is activated in order to deposit the metal on the plate when in the first step the detection means has not detected any defect in the plate.

13 Claims, 5 Drawing Sheets

METHOD FOR THE PRODUCTION AND CONTROL OF PLATES FOR ELECTRONICS AND RELATED APPARATUS

FIELD OF THE INVENTION

The present invention concerns a method for the production and control of plates or wafers for electronics and a relative apparatus.

In particular the present method is applied, preferably, but not exclusively, for the deposition of metal or other material, for example by means of silk-screen printing, on plates, for example green tape, or on silicon wafers, or similar material, or for other operations and for the control, in a substantially automatic manner, of plates and wafers thus made.

BACKGROUND OF THE INVENTION

Production and control methods, substantially automatic, in production lines of plates for electronics are known. Known methods normally comprise a first step in which a plate is positioned in a printing station. The method comprises a second step in which the plate is subjected to the deposition of metal or other material by a printing unit.

The method also comprises a third step in which the plate is moved from the printing station to a control and exit station where it is subjected to a conformity test, both to control that there are no cracks or micro-fractures and also that the metal or other material has been correctly deposited, according to the desired disposition.

The method comprises a fourth step in which the plate is moved to an exit station towards subsequent treatments or, if it has been identified as defective, is removed for example manually and collected in a suitable container or moved by means of suitable movement means towards a material recycling device.

One disadvantage of the known method is that the plate is subjected to the deposition of the metal even if it is defective, for example due to micro-fractures, and therefore destined to be discarded. This causes both a waste of material and of energy during the deposition of the metal, as well as a diminished productivity due to the time needed for the deposition on a defective plate.

A further disadvantage of the known method is that the removal of defective plates entails the use of specific movement means or the presence of personnel able to make the collection.

One purpose of the present invention is to perfect a method for the production and control for plates or wafers for electronics that allows to reduce energy and materials.

A further purpose of the present invention is to perfect a method that allows to increase the productivity of the deposition of metal or other materials on the plates or on the wafers.

A further purpose of the present invention is to perfect a method that allows to remove the defective plates substantially automatically.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with the above purposes, a method for the production and control of plates for electronics comprises a first step in which a plate is positioned by means of positioning means in a loading station.

The method comprises a second step in which said plate is moved to a deposition station associated with a unit for depositing metal or other materials, which is activated in order to deposit the metal, or other material, on the plate, so as to generate conductive and non-conductive tracks according to a desired and predetermined topological disposition.

The method comprises a third step in which the plate is moved from the deposition station to an exit station and a detection means is activated in order to detect the presence of defects in the plate. This with the purpose of verifying the physical integrity of the plate's support, detecting possible cracks generated accidentally during the deposition of material or following the movement towards the exit station.

The method comprises a fourth step in which the plate is discharged from the exit station.

According to a characteristic feature of the present invention, in the first step the plate, positioned in the loading station, is controlled by means of the detecting means so as to verify that there are no defects in said plate. In this way it is possible to detect in advance any possible fractures or cracks in the structure of the plate, which may be generated during the movement. In the second step the unit for depositing metal or other material is activated when the detection means has not detected defects on the plate. In this way it is possible to inhibit the deposition of metal on a defective plate, allowing to make savings both in the material to be deposited and also in the working time associated with the deposition of material on the plate.

According to a characteristic feature, in the fourth step the plate is discharged by means of the positioning means, in a first direction of discharge if the plate is not defective. If, however, at least one defect has been detected on the plate, the plate is discharged by means of the positioning means, in a second direction of discharge. In this way it is possible to eliminate defective plates, moving them for example towards a collection device, in the same way that plates with no defects are moved towards subsequent treatments.

According to a further characteristic feature the fourth step comprises a sub-step, subsequent to the discharge of the plate from the exit station, in which said positioning means is cleaned in order to remove impurities.

According to a variant said cleaning is performed by means of suction means.

The present invention also concerns an apparatus for the production and control of plates for electronics comprising a loading station for plates, an exit station for plates and at least an interposed station for the deposition of metal or other material, associated with a corresponding unit for the deposition of metal or other material. The deposition unit is suitable to deposit tracks of metal or other material on plates according to a predetermined and desired topological disposition.

The apparatus also comprises a transport member able to transport plates from the loading station to the exit station, passing through the deposition station.

The apparatus also comprises positioning means able to position a plate in the loading station and to discharge the plate from the exit station.

The apparatus also comprises detection means able to detect defects in the plates disposed in the exit station and on which metal or other material has been deposited for the generation of said tracks.

The apparatus comprises a control unit connected to the detection means and suitable to activate both the metal deposition unit, the transport member and also the positioning means.

According to a characteristic feature of the present invention the detection means is suitable to detect defects in plates positioned in the loading station. In this way it is possible to detect possible defects such as cracks and/or fractures in the structure of the plate and generated during the movement of the plates by the positioning means. The control unit activates the metal deposition unit if no defects have been detected in the plates or wafers by the detection means.

According to a variant the detection means comprises a TV camera.

According to a further variant the detection means comprises a pair of TV cameras. A first TV camera of the pair of TV cameras is associated with the loading station and a second TV camera of the pair of TV cameras is associated with the exit station.

According to a further characteristic feature of the present invention the control unit activates the transport member and the positioning means in order to move the plate without defects from the exit station in a first direction. In this way it is possible to direct plates without defects towards a subsequent treatment line.

According to a further characteristic feature of the present invention the control unit activates the transport member and the positioning means in order to move a defective plate from the exit station in a second direction, able to discharge the plate.

According to a variant the apparatus comprises means for removing impurities suitable for cleaning the positioning means, and activated by said control unit.

According to a variant the means for removing impurities comprises an air suction device.

BRIEF DESCRIPTION OF THE DRAWINGS

These and other characteristics of the present invention will become apparent from the following description of a preferential form of embodiment, given as a non-restrictive example with reference to the attached drawings wherein.

DETAILED DESCRIPTION OF A PREFERENTIAL FORM OF EMBODIMENT

With reference to the attached drawings, a method for the production and control of plates according to the present invention can be applied for depositing metal or other material on a plate, hereafter also called wafer 12, for generating tracks according to a desired topology.

Figure 1:
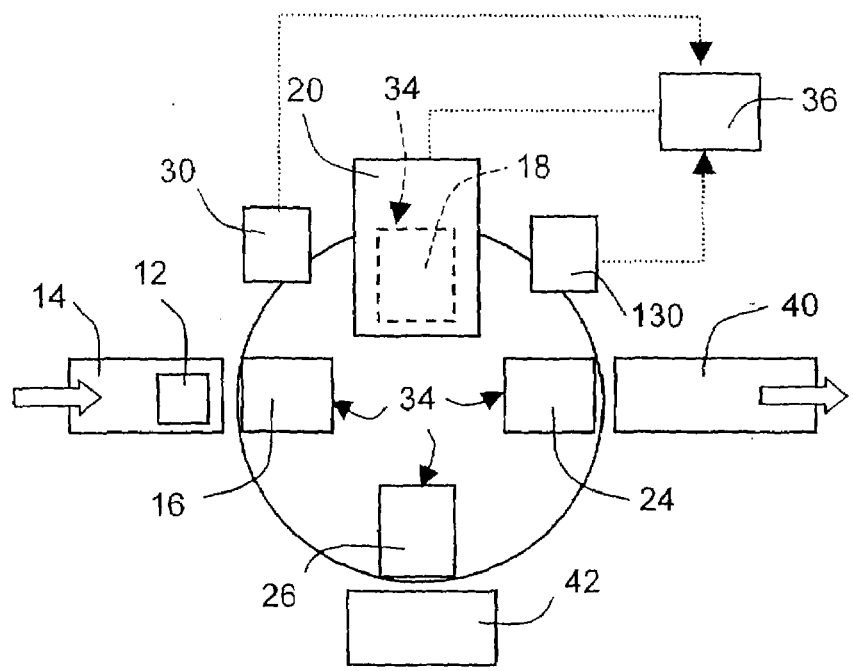
FIG. 1 is a schematic view of the method according to the present invention in a first step.
Figure 2:
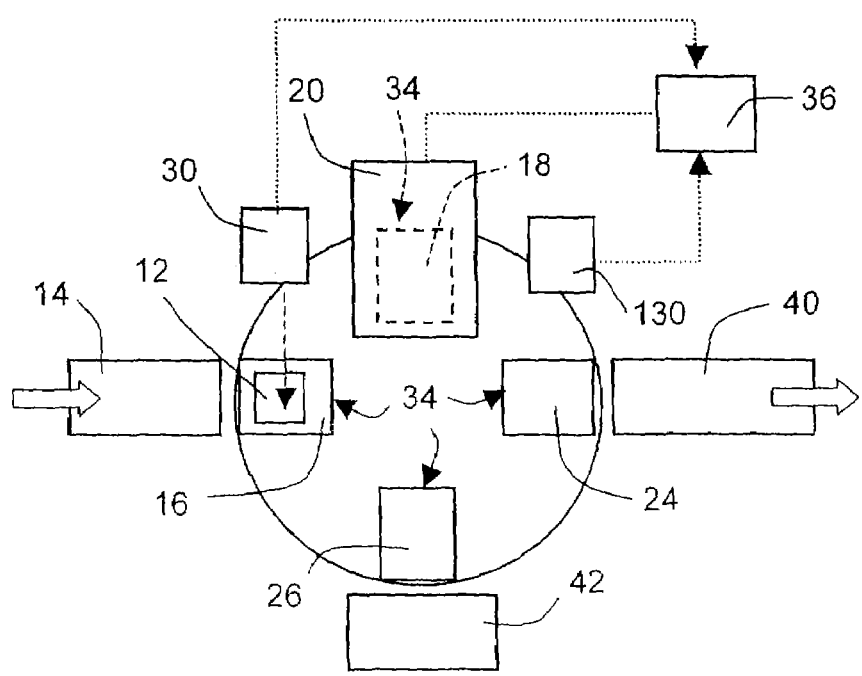
FIG. 2 is a schematic view of the method in the first step.

The method comprises a first step (FIGS. 1 and 2) in which the wafer 12, coming for example from an entry conveyor belt 14, is unloaded from the belt 14 into a loading station 16. The wafer 12 is disposed by means of positioning means, for example by a sliding belt 34 associated with the loading station 16, in a predetermined position on the loading station 16.

In the first step the wafer 12 also undergoes an inspection (FIG. 2), by means of a first TV camera 30, associated with a control unit 36 so as to detect possible defects in the wafer 12. Such defects can comprise cracks and/or fractures or other damage that accidentally occur in the fragile crystalline structure of the wafer, following the movements of the wafer on the entry belt 14 or in the transfer from the belt 14 to the loading station 16. In the first step the presence of defects in the wafer is signaled to the control unit 36.

Figure 3:
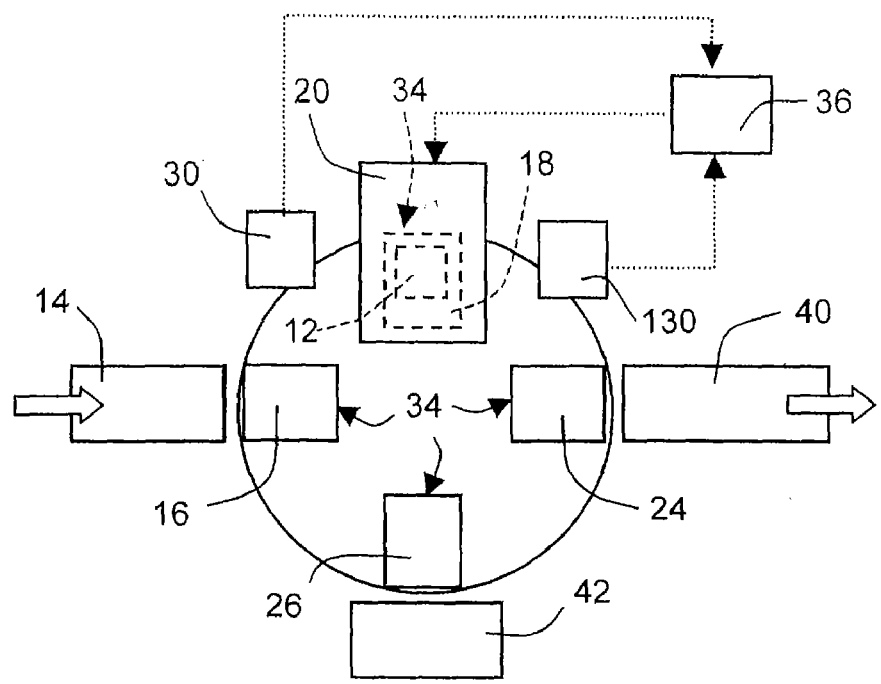
FIG. 3 is a schematic view of the method in a second step.
Figure 6:
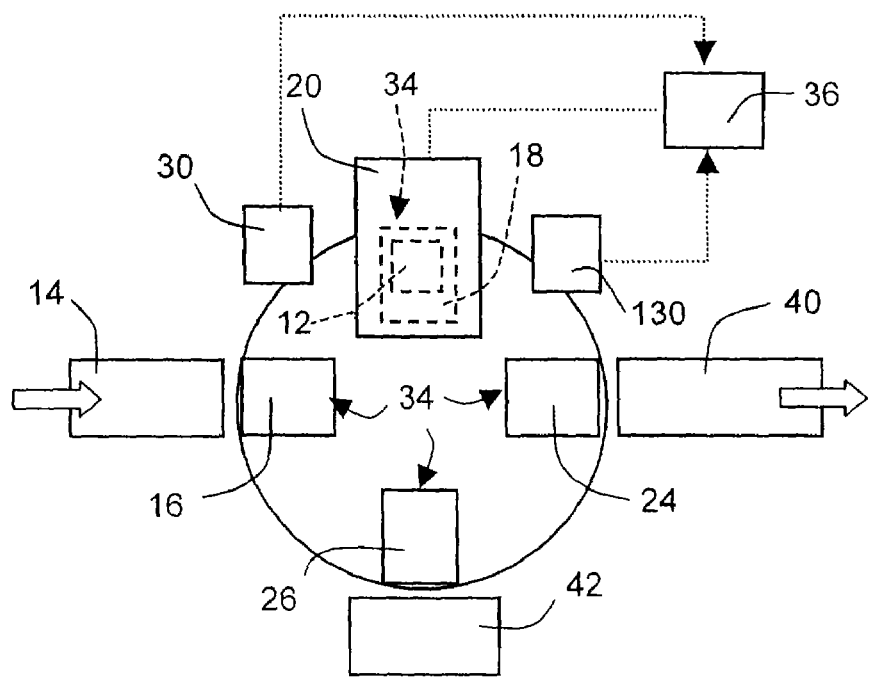
FIG. 6 is a schematic view of a detail of the method in the second step.

The method comprises a second step in which the wafer 12 is transferred from the loading station 16 to a metal deposition station 18 (FIGS. 3 and 6) associated with a deposition unit 20, for example by silk-screen printing, able to be activated by means of the control unit 36. In the second step the activation of the deposition unit 20 to deposit the metal on the wafer 12 happens (FIG. 3) only if in said first step no defect has been signaled in the wafer 12 currently positioned in the deposition station 18. On the contrary, if in the first step the TV camera has signaled the presence of defects in the wafer 12 disposed in the deposition station 18, the metal deposition unit 20 is not activated (FIG. 6).

In this way the deposition of metal on a defective wafer 12 is inhibited, therefore avoiding wasting metal material and allowing to considerably reduce the time the defective wafer 12 remains in the deposition station.

Figure 4:
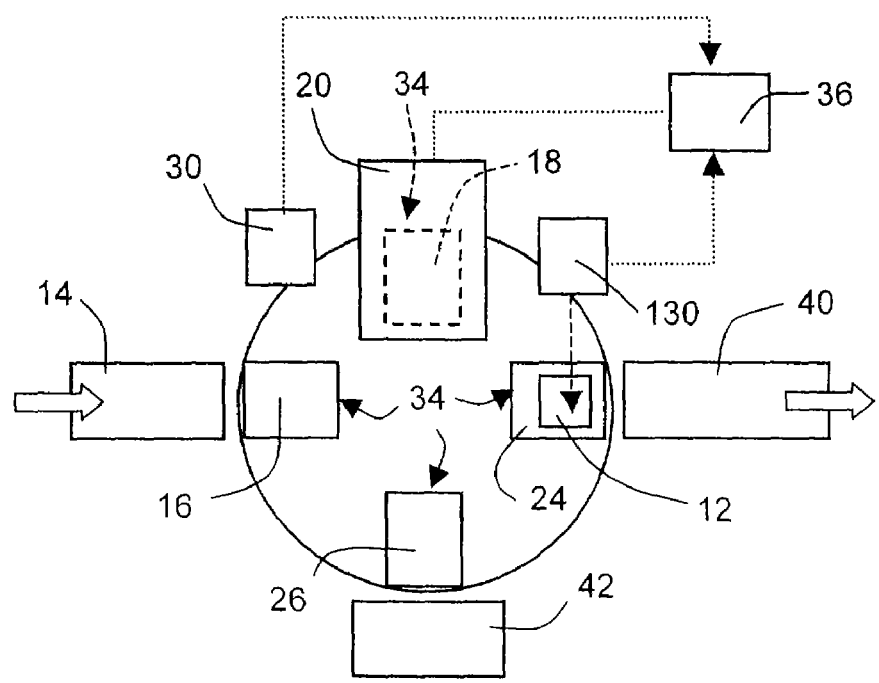
FIG. 4 is a schematic view of the method in a third step.
Figure 7:
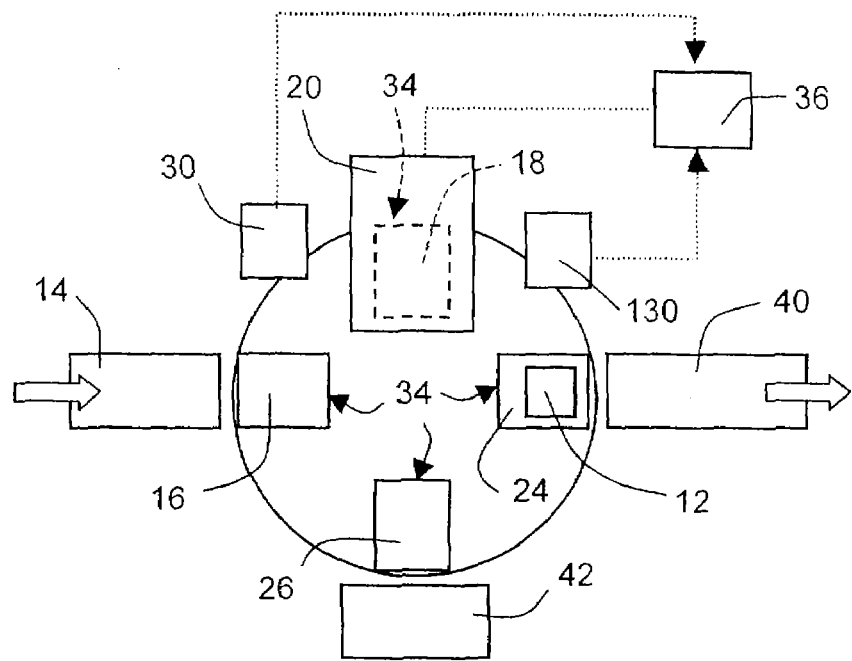
FIG. 7 is a schematic view of a detail of the method in the third step.
Figure 8:
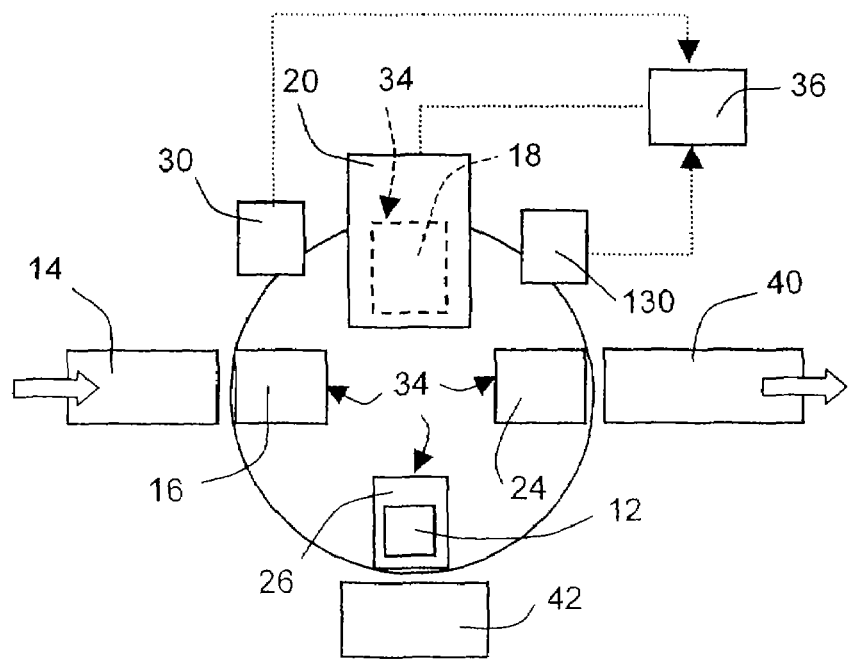
FIG. 8 is a schematic view of a detail of the method in the fourth step.

The method comprises a third step in which the wafer 12 is moved from the deposition station 18 to an exit station 24 (FIGS. 4 and 7). If the deposition unit 20 has not been activated in the second step, that is, if at least one defect has been detected in the first step in the wafer 12 disposed in the exit station 24, the second TV camera 130 is not activated (FIG. 7). If, instead, the deposition unit 20 has been activated in the second step, a second TV camera 130 is activated (FIG. 4) in order to detect any defects in the wafer 12.

Figure 5:
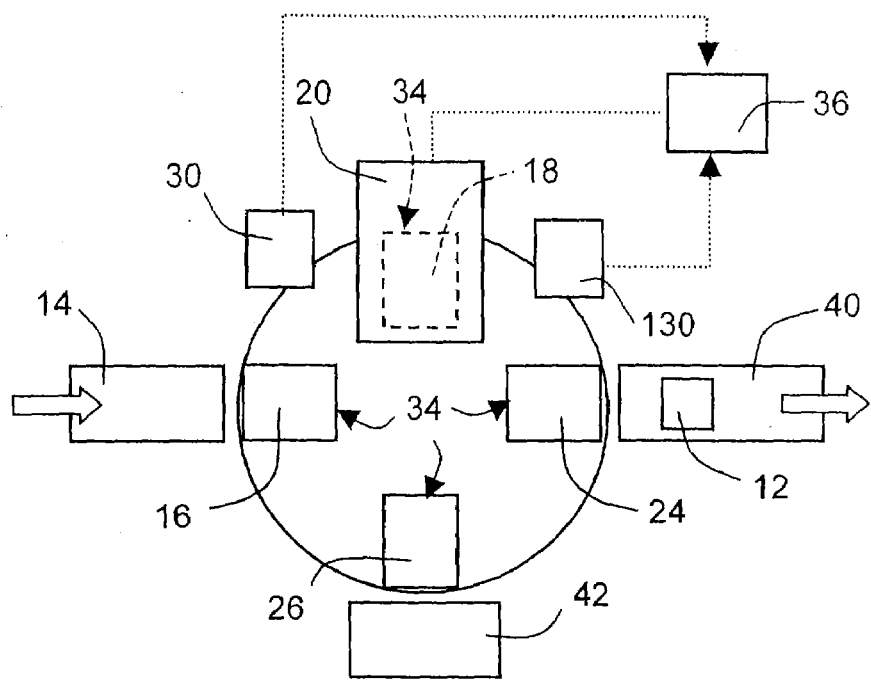
FIG. 5 is a schematic view of the method in a fourth step.
Figure 9:
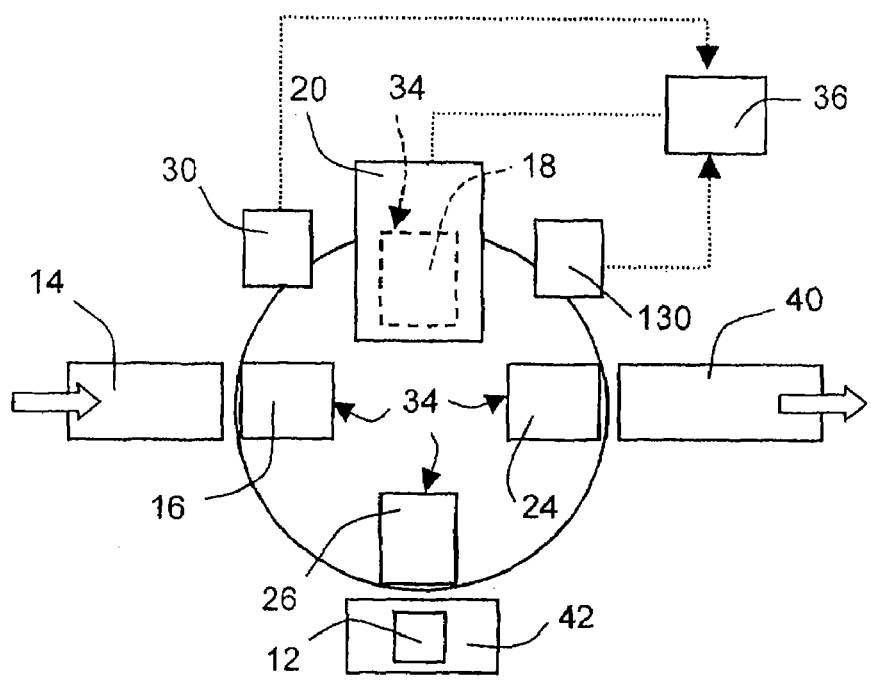
FIG. 9 is a schematic view of a detail of the method in the fourth step.

The method comprises a fourth step in which the wafer 12 is discharged from the exit station 24 by means of the positioning means 34. If no defect has been detected in the wafer 12 in the first or third step, the wafer disposed in the exit station 24 (FIGS. 4 and 5) is transferred by means of the positioning means 34 for example towards an adjacent exit conveyor belt 40 towards subsequent treatments. If in the wafer 12 at least one defect has been detected, in the first or third step, the wafer 12 disposed in the exit station 24 (FIG. 7) is moved to a discharge station 26 and transferred, in a substantially automatic manner by means of the positioning means 34, towards an adjacent collection container 42 for defective wafers 12 (FIG. 9).

The present invention also concerns an apparatus 10 that can be applied to deposit metal on a silicon wafer.

Figure 10:
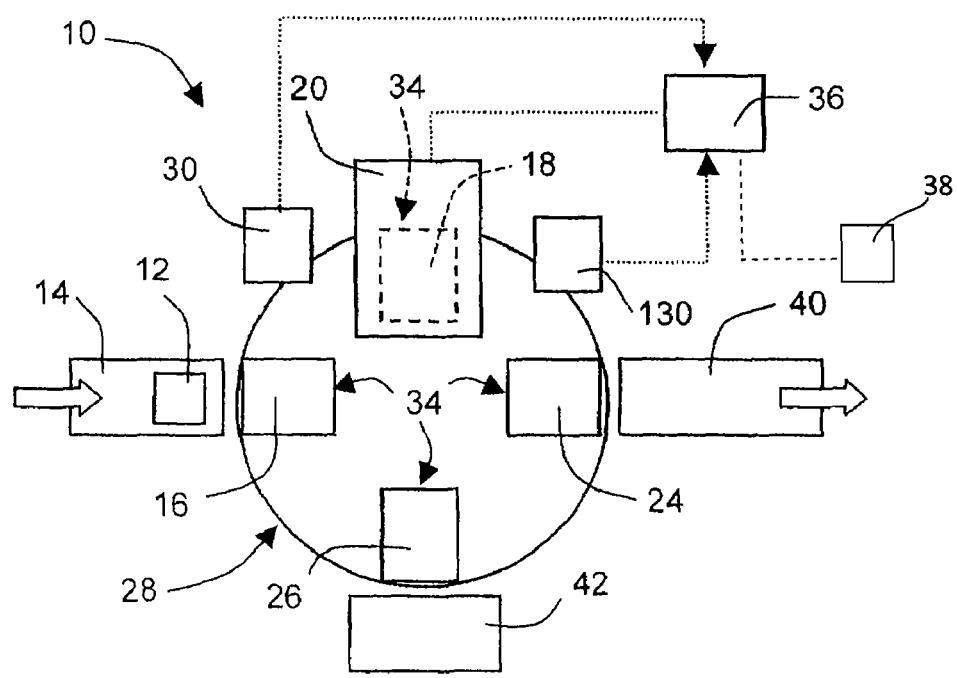
FIG. 10 is a schematic view of an apparatus according to the present invention.

The apparatus 10 (FIG. 10) comprises a loading station 16 for wafers 12, an exit station 24 and an interposed deposition station 18 associated with a metal deposition unit 20, suitable to deposit metal tracks on a wafer 12 according to a predetermined and desired topological disposition.

The apparatus 10 comprises a rotating turret 28 suitable for transporting wafers 12 from the loading station 16 to the exit station 24 passing through the deposition station 18.

The apparatus 10 also comprises positioning belts 34, of the known type, able to position a wafer 12 in the loading station 16 and to discharge wafers 12 from the exit station 24 towards an exit conveyor belt 40. The positioning belts 34 are associated with the rotating turret 28.

The apparatus 10 also comprises a TV camera 130 associated with the exit station 24 and suitable to detect defects in the wafer 12 disposed in the exit station 16. Such defects comprise cracks and/or fractures in the silicon structure of the wafer 12 or defects produced during the deposition of the metal tracks or during the movement of the wafer 12 from the deposition station 18 to the exit station 24.

The apparatus 10 also comprises a control unit 36 connected to the TV camera 130 and suitable to activate both the deposition unit 20 and the rotating turret 28 as well as the positioning belts 34. Further, the apparatus 10 comprises means for removing impurities suitable for cleaning the positioning belts 34, and activated by said control unit 36. The means for removing impurities comprises an air suction device 38.

According to a characteristic feature the apparatus also comprises a TV camera 30 associated with the loading station 16 and connected to the control unit 36 so as to detect defects in the wafer 12 disposed in the loading station 16.

The apparatus 10 described heretofore functions as follows.

A wafer 12, for example coming from an entry conveyor belt 14, is unloaded into the loading station 16 where it is positioned, by means of the positioning belts 34, in a predetermined position.

The wafer 12 is subjected to inspection by the TV camera 30 in order to identify possible defects therein. Possible defects are signaled to the control unit 36.

The wafer 12 is transferred by means of the rotating turret 12 from the loading station 16 to the metal deposition station 18. If no defect has been detected in the wafer 12, the deposition unit 20 is activated by the control unit 36. If, instead, the TV camera 30 has signaled the presence of defects in the wafer 12, the metal deposition unit 20 is not activated.

In this way the deposition of metal on a defective wafer 12 is inhibited, therefore avoiding wasting metal material and allowing to considerably reduce the time a defective wafer 12 remains in the deposition station.

The wafer 12 is moved by the rotating turret 28 from the deposition station 18 to an exit station 24 (FIGS. 4 and 7).

If no defect has been detected, the wafer 12 disposed in the exit station 24 is transferred by the positioning belt 34 towards an adjacent exit conveyor belt 40.

If at least one defect has been detected, the wafer 12 disposed in the exit station 24 is moved by means of the rotating turret 28 to the discharge station 26 and transferred, in an automatic manner by means of the positioning means 34, towards an adjacent container for the collection of defective wafers 12.

It is clear that modifications and/or additions of parts may be made to the method and apparatus 10 as described heretofore, without departing from the field and scope of the present invention. For example, it comes within the field and scope of the present invention to provide a single TV camera 30 for detecting defects, mobile between a first position associated with the loading station 16 and a second position associated with the exit station 24. The TV camera 30 moves by means of sliding means of a known type and is commanded by the control unit 36, in a manner coordinated with the step of the method and/or the position of the wafers 12 to be controlled.

It is also clear that, although the present invention has been described with reference to some specific examples, a person of skill in the art shall certainly be able to achieve many other equivalent forms of method for the production and control of silicon wafers and relative apparatus, having the characteristics as set forth in the claims and hence all coming within the field of protection defined thereby.

The invention claimed is:

1. A wafer processing apparatus, comprising:
   a loading station;
   an exit station;
   at least one deposition station;
   a discharge station;
   a pivoting turret having a plurality of sliding belts mounted around the pivoting turret, wherein the loading station, the deposition station, the exit station and the discharge station are positioned around the pivoting turret such that the pivoting turret can transfer a wafer between the loading station, the deposition station, the exit station and the discharge station, wherein, following a direction of pivoting, the deposition station is positioned between the loading station and the exit station, and the discharge station is positioned between the exit station and the loading station;
   a first inspection device positioned to detect defects in wafers disposed in the loading station;
   a second inspection device positioned to detect defects in wafers disposed in the exit station; and
   a control unit programmed to inspect the wafer using the second inspection device and to discharge the wafer from the exit station along a first direction of discharge if no defects are detected by the second inspection device and to discharge the wafer from the discharge station along a second direction of discharge if defects are detected by the second inspection device.

2. The apparatus of claim 1, wherein the pivoting turret is positioned to discharge wafers with defects from the discharge station towards an adjacent collection container for defective wafers.

3. The apparatus of claim 1, wherein the first and second inspection devices each comprise at least a TV camera.

4. The apparatus of claim 2, wherein the control unit is configured to activate the deposition station if the first inspection device indicates the wafer has no defect, and then to activate the second inspection device after the deposition.

5. The apparatus of claim 4, further comprising an air suction device for removing impurities from at least one of the sliding belts, wherein the air suction device is activated by the control unit.

6. A wafer processing apparatus, comprising:
   a loading station;
   an exit station;
   at least one deposition station positioned between the loading station and the exit station;
   a discharge station positioned between the exit station and the loading station;
   at least one deposition unit positioned over the at least one deposition station;
   a pivoting turret having a plurality of sliding belts arranged around the pivoting turret, wherein the pivoting turret is positioned to transfer wafers between the loading station, the deposition station, the exit station, and the discharge station on the sliding belts;
   a first inspection means positioned to detect defects in wafers disposed in the loading station;
   a second inspection means positioned to detect defects in wafers disposed in the exit station; and
   a control unit programmed to inspect the wafer using the second inspection means and to discharge the wafer from the exit station along a first direction of discharge if no defects are detected by the second means device and to discharge the wafer from the discharge station along a second direction of discharge if defects are detected by the second inspection device.

7. The apparatus of claim 6, further comprising means to remove impurities from the sliding belts positioned in at least one of the exit station and discharge station.

8. The apparatus of claim 7, wherein the means to remove impurities comprises an air suction device.

9. The apparatus of claim 6, further comprising a collection container positioned adjacent the discharge station.

10. The wafer processing apparatus of claim 2, wherein:
the control unit is programmed to perform a method, the method comprising:
positioning a wafer in a loading station;
inspecting the wafer to detect defects using the first inspection device;
positioning the wafer in a deposition station;
depositing metal or other material onto the wafer if defects were not detected during inspection;
positioning the wafer in an exit station;
inspecting the wafer and deposited metal or other materials to detect defects using the second inspection device; and
positioning the wafer in a discharge station if defects were detected during inspection.

11. The wafer processing apparatus of claim 10, wherein the control unit is further programmed to clean at least one of the exit station and discharge station after discharging the wafer.

12. The wafer processing apparatus of claim 11, wherein cleaning at least one of the exit station and discharge station after discharging the wafer comprises cleaning by means of air suction.

13. The wafer processing apparatus of claim 10, wherein the first and second inspection devices each comprise at least one TV camera.

* * * * *